United States Patent [19]
Tielert et al.

[11] Patent Number: 4,769,778
[45] Date of Patent: Sep. 6, 1988

[54] CIRCUIT ARRANGEMENT COMPRISING A MATRIX-SHAPED MEMORY ARRANGEMENT FOR DIGITAL FILTRATION OF IMAGE SIGNALS IN ROW AND COLUMN DIRECTIONS

[75] Inventors: Reinhard Tielert; Bernd Zehner, both of Munich, Fed. Rep. of Germany

[73] Assignee: Siemens Aktiengesellschaft, Berlin and Munich, Fed. Rep. of Germany

[21] Appl. No.: 831,791

[22] Filed: Feb. 21, 1986

[30] Foreign Application Priority Data

Feb. 25, 1985 [DE] Fed. Rep. of Germany ....... 3506561

[51] Int. Cl.⁴ .............................................. G06F 15/31
[52] U.S. Cl. ................................................. 364/724.05
[58] Field of Search .................... 364/724; 358/37, 166

[56] References Cited
U.S. PATENT DOCUMENTS

| 4,454,590 | 6/1984 | Belt et al. | 364/724 |
| 4,542,475 | 9/1985 | Acamporu | 364/724 |
| 4,590,582 | 5/1986 | Umemura | 364/724 |
| 4,602,285 | 7/1986 | Beaulier et al. | 364/724 X |

Primary Examiner—David H. Malzahn
Attorney, Agent, or Firm—Hill, Van Santen, Steadman & Simpson

[57] ABSTRACT

A circuit arrangement comprises a matrix-shaped memory arrangement for digital filtration of image signals in row and column directions and contains three-transistor cells having overlapping write/read cycles as storage elements. A row selector is clocked controlled by the input clock of the incoming image signals and is continuously steppable and resettable at any time. The row selector comprises, respectively, two phase offset signal outputs per selection step which respectively drive a write word line and a read word line and which are provided per row of the matrix. Two separate bit lines, a write bit line and a read bit line, are provided per column and are respectively interconnected to all memory cells of the column. A storage amplifier which is disconnectible from the read bit line is provided per column and has an input connected to the read bit line of the assigned column and an output connected to the bit write line of the following column and serves as a data output. A reset input is connected to the setting inputs of a first element of the row selector as well as to the reset inputs of the remaining elements of the row selector. The chronological spacing between reset pulses is selected such that it equals the required delay time to be set between the undelayed data output and a first, delayed data output. A plurality of such memory-shaped memory arrangements is provided in accordance with the word width of the image data the row selector being provided in common for such plurality, whereby a respective memory block accepts one bit of the image data word and offers the same as the respective corresponding bit of a plurality of differently time delayed output data words. An arithmetic unit combines the data outputs, by adding or, respectively, subtracting, in an arrangement of cascaded logic elements in order to achieve the required filter function.

6 Claims, 12 Drawing Sheets

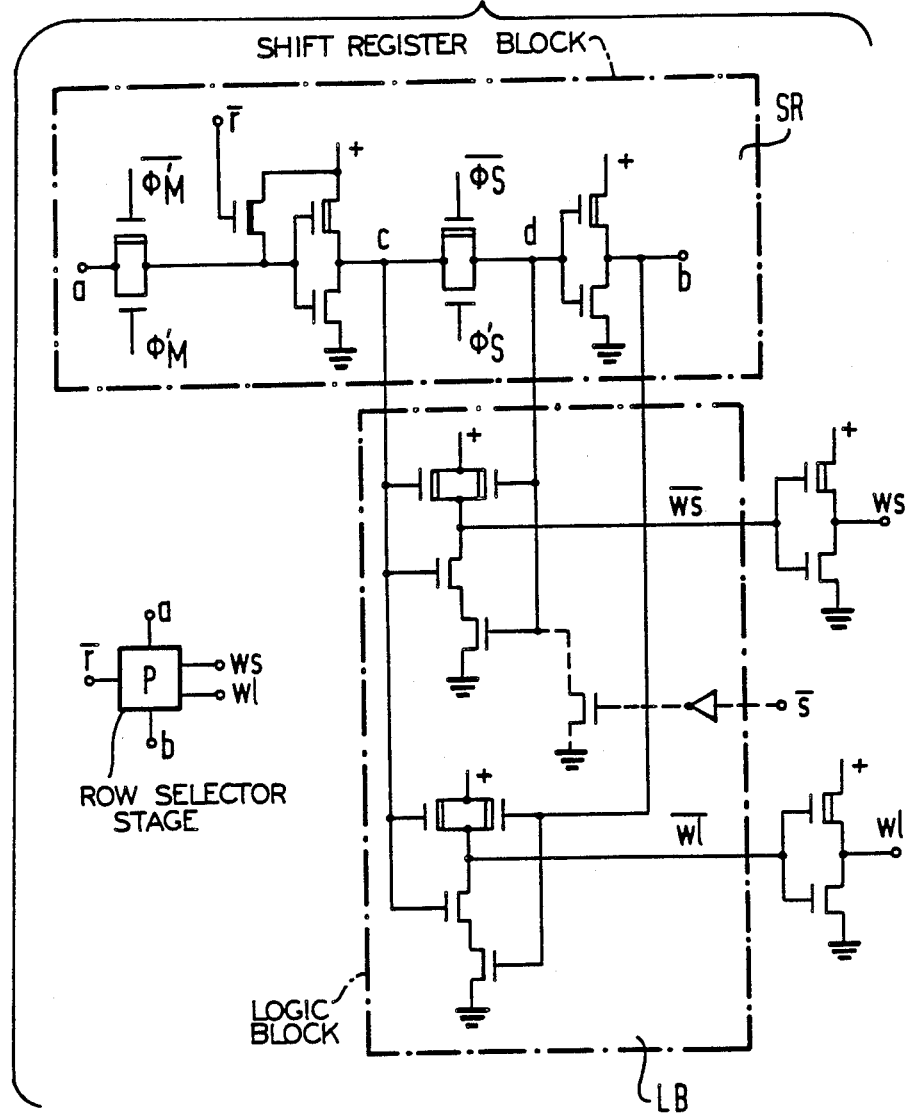

CIRCUIT ARRANGEMENT COMPRISING A MATRIX-SHAPED MEMORY ARRANGEMENT FOR DIGITAL FILTRATION OF IMAGE SIGNALS IN ROW AND COLUMN DIRECTIONS

CROSS REFERENCE TO RELATED APPLICATIONS

This application is related to application Ser. No. 828,512 filed Feb. 12, 1986 and application Ser. No. 828,513 filed Feb. 12, 1986.

BACKGROUND OF THE INVENTION

1. Field of the Invention

The present invention relates to a circuit arrangement comprising a matrix-shaped memory arrangement for digital filtration of image signals in row and column directions for the purpose of reducing the redundancy in the image signals.

2. Description of the Prior Art

The digital transmission of color picture signals via the channels of the pulse code modulation (PCM) hierarchy of a transmission network requires a data reduction by reducing the sampling frequency for reasons of the nature of the appertaining transmission channels. A respectively required codec therefore requires digital filters for decimation or, respectively, interpolation. Horizontally or, respectively, vertically adjoining image dots, referred to below as orders $0_0, 0_1 \ldots 0_6$, must be binarily weighted and added in the filters (cf. FIG. 1). Six scanning lines must be kept ready in line memories to this end for filtration in the vertical direction.

Digital filters of this type for a test system on the basis of standard modules have already been realized. Static CMOS-RAMs are employed therein for the realization of the required line memories, whereby the access to the line memory cells occurs by incrementing a counter and decoding the counter reading. An arithmetic unit required for such digital filters is composed of cascaded adders and registers. The space requirement and the expenses are relatively high given such a construction. The data rates which can be achieved are limited by the cycle time of the static memory cells which are disadvantageous. Moreover, the memory access via a decoder, given the cyclical operating mode required in the present case is involved and, therefore, inefficient. Finally, an integration of this solution is not particularly suitable because of the irregularity of the resulting circuit structure.

SUMMARY OF THE INVENTION

The object of the present invention, therefore, is to provide a regularly structured, surface-favorable circuit arrangement which is also useable at higher data rates, and in particular the creation of such a circuit arrangement on the basis of a few, adapted basic cells for the purpose initially set forth.

According to the invention, the above object is achieved in a circuit arrangement comprising a matrix-shaped memory arrangement for digital filtration of image signals in the row direction and in the column direction which is characterized in that known pre-transistor cells having overlapping write/read cycles are provided as storage elements, in that a row selector is clock-controlled by the input data clock of the incoming image signals and is continuously steppable and resettable at any time, the row selector comprising, respectively, two phase offset signal outputs per selection step which respectively drive a write word line and a read word line which are provided per row of the matrix, and that two separate bit lines are provided per column, namely a write bit line and a read bit line which are respectively interconnected to all memory cells of the column. The arrangement is further characterized in that a storage amplifier is provided per column, the storage amplifier being disconnectible from the read bit line, the input of the storage amplifier being connected to the read bit line of the column assigned thereto and the output of the amplifier being connected to the write bit line of the following column and serves as a data output. A data input for the image signals to be delayed is connected to the write bit line of the first column and to an undelayed data output. A reset input is connected to setting inputs of a first element of the row selector and is also connected to the reset inputs of the remaining elements of the row selector. The chronological spacing between reset pulses is selected such that it equals the required delay time to be set between the undelayed data output and the first common delayed data output. A plurality of such memory-shaped memory arrangements, namely memory blocks, is provided in accordance with the word width of the image data, the row selector being provided in common for the plurality of matrix-shaped memory arrangements, whereby respective memory block accepts one bit of the image data word and offers the same as the respectively corresponding bit of a plurality of differently time delayed output data words. An arithmetic unit is provided in which the data outputs are combined, i.e. added or, respectively, subtracted, in an arrangement of cascaded logic elements, the outputs being combined for achieving the required filter function that, first, two outputs with the smallest amount coefficients are combined with one another, the result, after weighing which may be required in accordance with the filter function, being combined with the output of the next highest amount coefficient, the result again being weighted under given conditions, etc. Finally, digital time delay elements are provided at appropriate locations for adapting differently occurring transit times in the cascaded arrangement.

BRIEF DESCRIPTION OF THE DRAWINGS

Other objects, features and advantages of the invention, its organization, construction and mode of operation will be best understood from the following detailed description, taken in conjunction with the accompanying drawing, on which:

FIG. 8 is a symbolic representation of a row selector stage and the equivalent circuit diagram thereof, this stage being employed n-fold in the circuit arrangement of FIG. 2;

DESCRIPTION OF THE PREFERRED EMBODIMENTS

Figure 2:
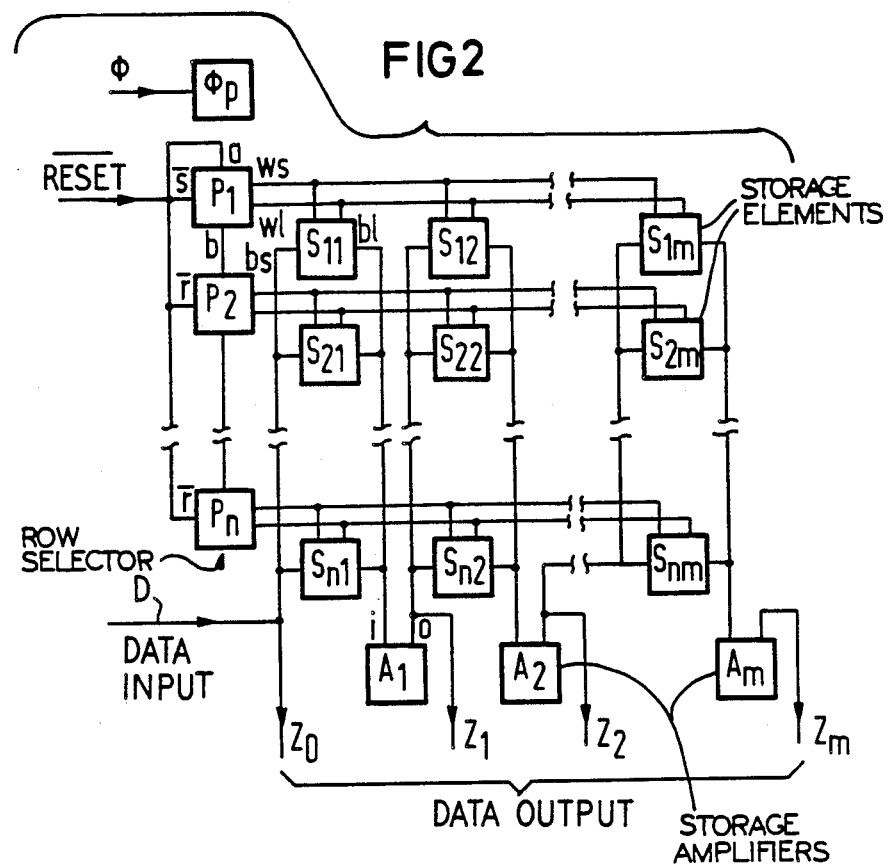
FIG. 2 is a block circuit diagram of a matrix-shaped memory arrangement which forms an essential part of the circuit arrangement of the present invention.
Figure 6:
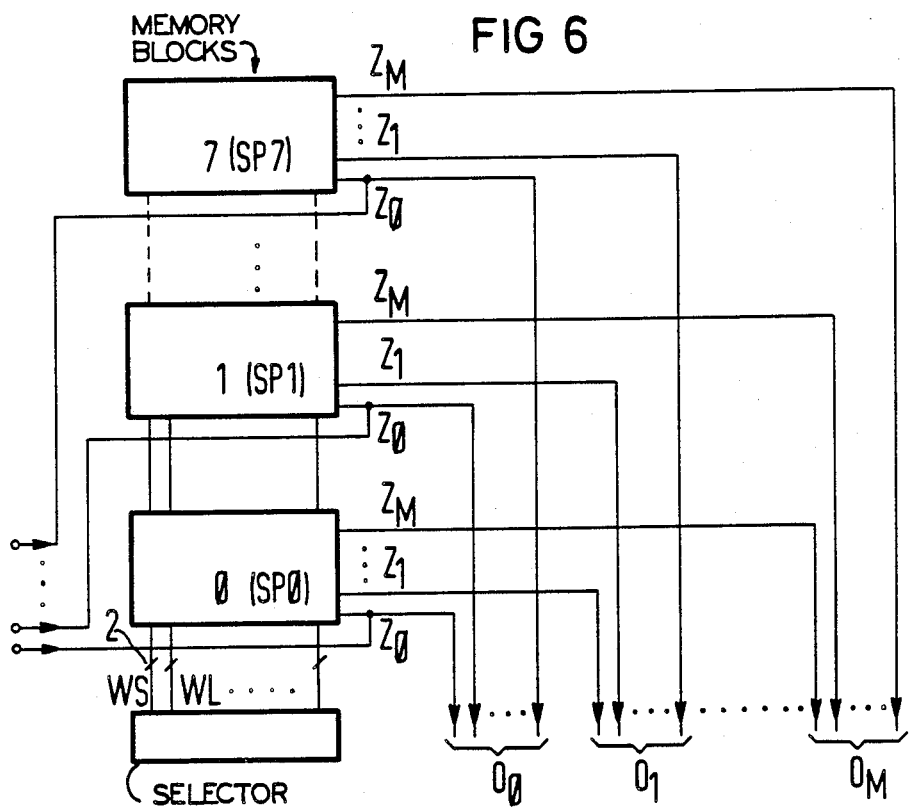
FIG. 6 is a block circuit diagram of an arrangement in which a plurality of memory blocks and a row selector are provided in accordance with the word width of the data words to be delayed.

The time delay unit provided for the circuit arrangement of the present invention is based on a circuit arrangement as illustrated in FIG. 2 which has already been briefly discussed. The circuit arrangement shown in FIG. 2 represents what is referred to as a first-in-first-out buffer memory (FIFO) of variable length for one bit. The access occurs cyclically via a line or row selector $P_1 \ldots P_n$. With every work clock, the information in the row of a column which is just now activated is shifted toward the right. The delay time is variable within broad limits for this row selector via a reset signal $\overline{Reset}$. Such a memory block as shown in FIG. 6 is required for each bit of an input data word. The column count per block is established by the size of the order required in the filter and the row count corresponds to the plurality of points per image line.

Figure 4:
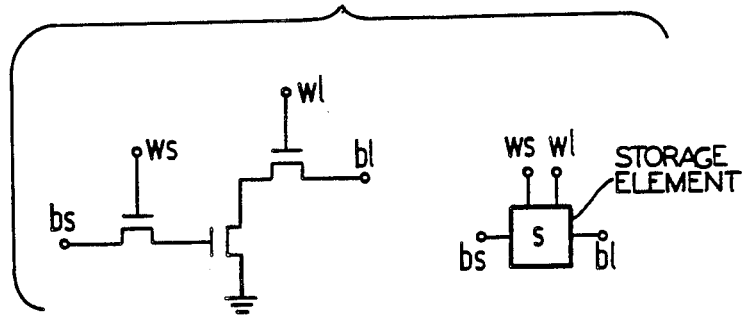
FIG. 4 is a symbolic illustration contained in FIG. 2 and a fundamental circuit diagram of a corresponding three-transistor memory cell as employed n×m-fold in the memory arrangement of FIG. 1.

Known three transistor cells having overlapping write/read cycles are provided as storage elements in such a memory arrangement (cf. FIG. 4). The row selector $P_1 \ldots P_n$ is a row selector clocked by the input data clock of the incoming data signals is continuously steppable and can be reset at any time and comprises two phase offset signal outputs per selection step which respectively select a write word line ws or, respectively, a read word line wl which are provided per row of the matrix (cf. FIG. 8). Two separate lines, namely a write bit line bs and a read bit line bl, are provided per column, these being respectively interconnected to all memory cells of a column. A storage amplifier $A_1 \ldots A_m$ which is disconnectible from the read bit line is provided per column, the input i thereof being connected to the read bit line bl of the column assigned thereto and the output o thereof being connected to the write bit line bs of the following column and serving as a data output $Z_1 \ldots Z_m$ assigned thereto. A data input for the image signals to be delayed is connected to the write bit line bs of the first column and to an undelayed data output $Z_0$. A reset input $\overline{Reset}$ is connected to setting inputs a, $\bar{s}$ of a first element $P_1$ of the row selector as well as to the reset inputs $\bar{r}$ of the remaining elements $P_2 \ldots P_n$ of the row selector. The chronological spacing between the reset pulses $\overline{Reset}$ is selected such that it equals the required delay time which is to be set between the undelayed data output $Z_0$ and the first, delayed data output $Z_1$.

As already set forth, a plurality of such matrix-shaped memory arrangements are provided in accordance with the word width of the image data, namely memory blocks $SP_0 \ldots SP_7$ (cf. FIG. 6) for which the row selector $P_1 \ldots P_n$ is provided in common, whereby a respective memory block accepts one bit of the image data word and offers the same as the respectively corresponding bit of a plurality of differently time-delayed output data words $O_0 \ldots O_m$. An arithmetic unit is also provided (cf. FIG. 7, FIG. 9, FIG. 10, FIG. 11, FIG. 14) in which the data outputs $O_0 \ldots O_m$ are combined, i.e. added or, respectively, subtracted, in an arrangement of cascaded logic elements, being combined such for achieving the required filter function that, first, two outputs $O_i$ having the smallest amount coefficients are combined with one another, the result (after potential weighting required in accordance with the filter function) being combined with the output $O_i$ having the next largest amount coefficient, the result again weighted under given conditions, etc., whereby digital time-delay elements T are provided at appropriate locations for the adaptation of the differently occurring transit times in the cascaded arrangement.

Figure 1:
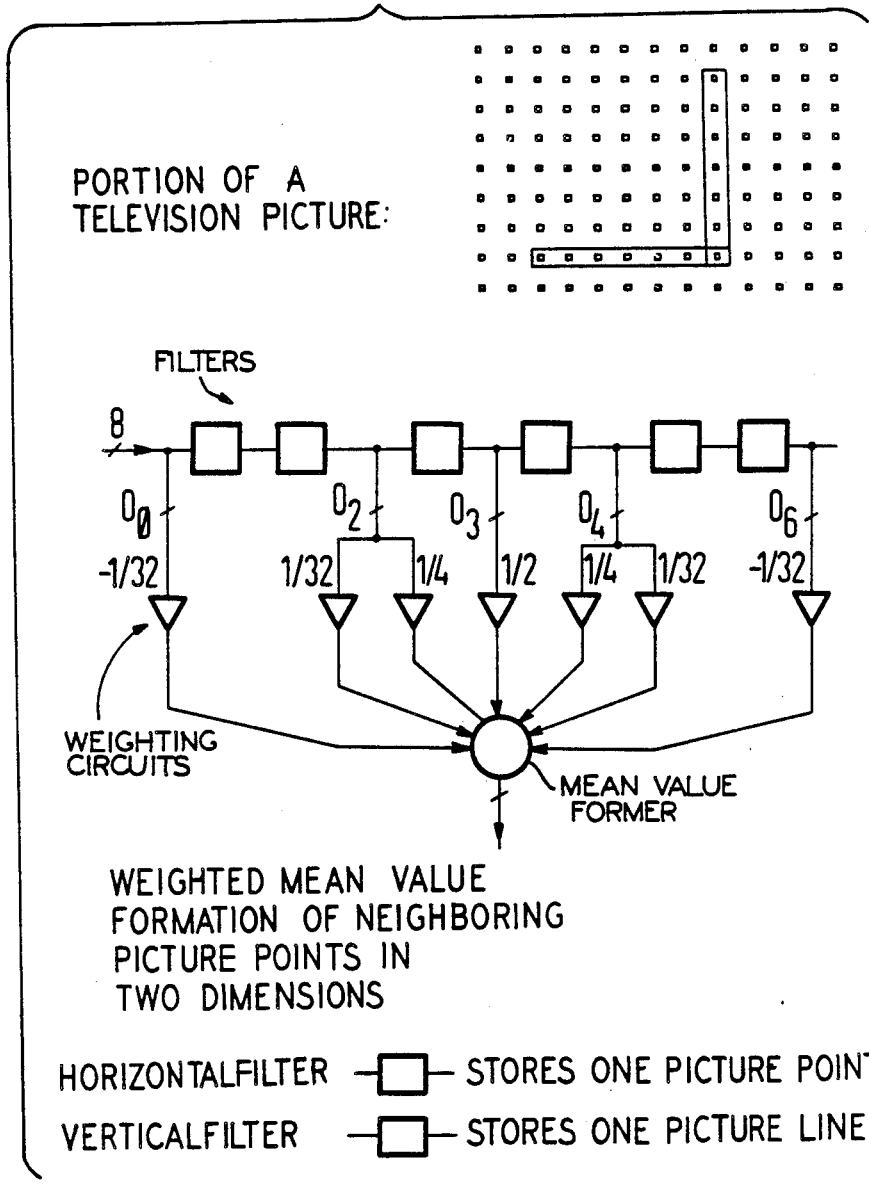
FIG. 1 is a schematic illustration of the principle of two image filters, namely a horizontal filter which stores six image dots, and a vertical filter which stores six image lines.

FIG. 6 illustrates how a delay element which offers the orders $O_0, O_2 \ldots O_6$ for the filter of FIG. 1 is to be compounded by duplication of memory blocks of the type set forth above. Each of the memory blocks $SP_0 \ldots SP_7$ thereby represents a memory field as shown bounded by broken lines in FIG. 2. The individual memory blocks can thereby be fused to form a large memory field and the access can occur via a row selector assigned in common thereto. The external reset signal $\overline{Reset}$ defines the operating mode of the filter. When the reset pulse respectively arrives after a row, then vertically adjoining image dot bits are available at the outputs of the arrangements shown in FIG. 6. When, by contrast, resetting is carried out with every clock pulse, then the horizontally adjoining image dot bits appear. In this case, the major portion of the memory field remains unused.

As already set forth, FIG. 4 shows the three-transistor cell employed, the principle thereof being based on the fact that the information to be stored is dynamically stored on the gate of a metal-oxide-semiconductor (MOS) transistor (the middle of the three transistors). As indicated by the terminal designations, this known three-transistor cell is employed in a special operating mode wherein separate bit lines are used for reading and writing (cf. FIG. 2), whereby the possibility occurs of reading and writing in a single clock cycle.

Figure 5:
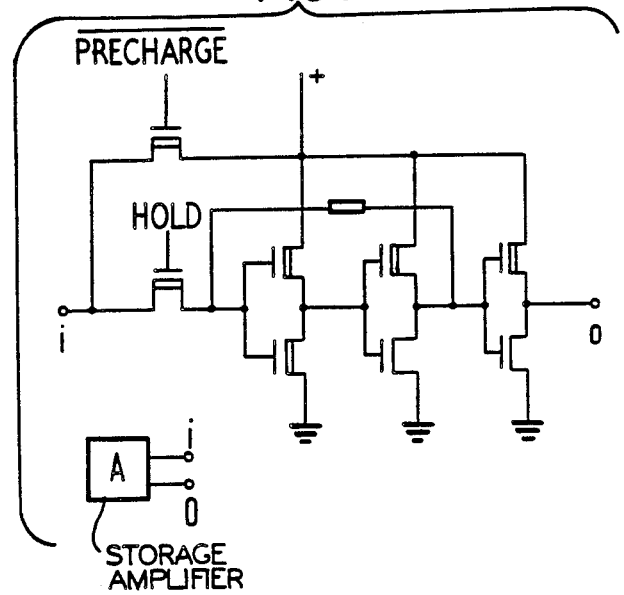
FIG. 5 is a symbolic illustration of an element contained in FIG. 2 and the equivalent circuit diagram of a regenerator (amplifier circuit) as employed m-fold in the circuit arrangement of FIG. 2.

As already set forth, FIG. 5 shows a regenerator or amplifier. The job of this regenerator is to amplify the read signal appearing attenuated on the read bit lines bl assigned to its input i to the standard level and to output the same onto the capacitively highly-loaded write bit line bs assigned to its output o. The circuit of this regenerator contains a three-stage inverter arrangement comprising a co-coupling path contained therein. The inverter arrangement is preceded by a switch which, controlled by a hold signal, disconnects the inverter arrangement from the input i each time the read bit line is precharged for the next clock cycle and thereby retains the stepped-in information. The precharging is thereby effected by a further switch controlled by the Precharge signal.

As also already set forth, FIG. 8 shows a row selector stage P. Two dynamic register stages which are disconnectible from one another or, respectively, from the signal input a by switches controlled via auxiliary clocks $\overline{\phi'_M}$, $\phi'_M$, $\overline{\phi_S}$, $\phi_S$ are provided in a shift register block SR. The auxiliary clocks $\phi'_M$ and $\phi'_M$ correspond to the auxiliary clocks $\phi_M$ and $\phi_M$ according to the pulse/time diagram of FIG. 3. However, they represent result signals of a logical combination of the appertaining signals shown in FIG. 3 with the reset signal. This combination effects a closing of the switch at the input of the shift register block SR for the duration of the reset signal. Two logic elements are provided in a logic block LB, these logic elements combining the signals appearing at the points c, d, b with one another in accordance with the relationships $$\overline{ws} = \overline{c \cap d}; \text{ and}$$

$$\overline{wl} = \overline{c \cap b}.$$

The output signals $\overline{ws}$ and $\overline{wl}$ of the logic block LB are switched by way of inverting drivers, thus being switched onto the write word line ws or, respectively, onto the read word line wl of the appertaining row of the matrix-shaped memory arrangement. A respective reset input $\bar{r}$ is provided for the stages $P_2 \ldots P_n$ of the row selector according to FIG. 2. This is replaced in the stage $P_1$ by a setting input $\bar{s}$, as indicated with a broken line in FIG. 8.

Figure 3:
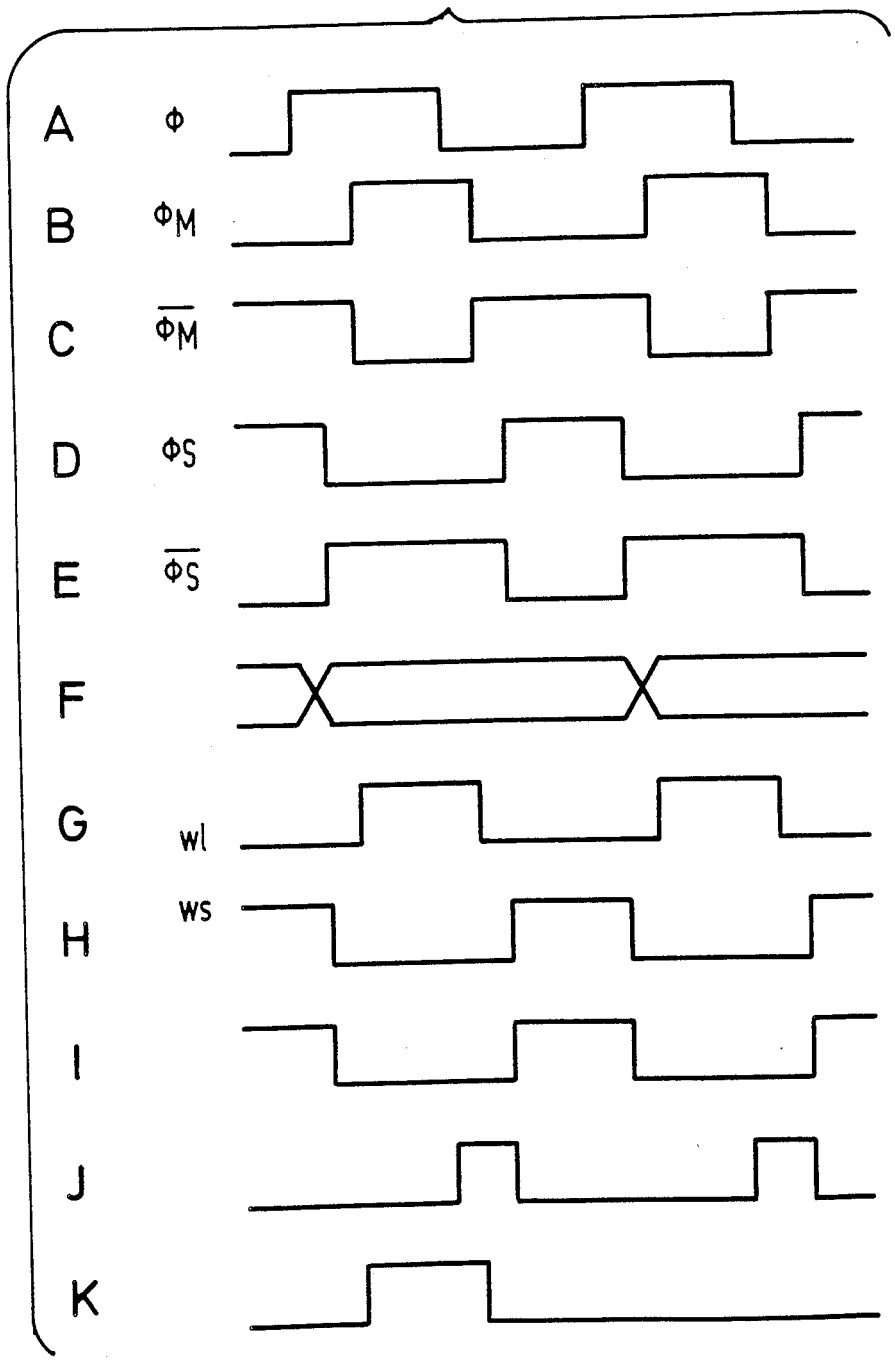
FIG. 3 is a pulse/time diagram for explaining the manner of operation of the matrix-shaped memory arrangement shown in FIG. 2.

As indicated above, FIG. 3 is a pulse/time diagram for illustrating the manner of operation of the circuit arrangement constructed in accordance with the present invention.

Line A illustrates the basic clock $\phi$ applied to the clock controller. Auxiliary clocks for the control of the row selector (cf. FIG. 8 as well), namely $\phi_M$, $\phi_{M'}$, $\phi_S$ and $\phi_{S'}$ are illustrated in lines B, C, D and E, respectively. Line F shows the phase relation of the input data stream with respect to the basic clock $\phi$. Lines G and H show the output signals of the row selector, namely the read word line signal wl and, respectively, the write word line signal ws. Lines I and J show a precharge signal and, respectively, a hold signal which are employed for the control of the regenerator circuits (cf. FIG. 5 as well). Line K, finally, shows the phase relation of the required reset signal with respect to the basic clock $\phi$. The reset signal $\overline{\text{Reset}}$ which is supplied to the reset input is preferably offered with the input signals. It is also provided that only those data outputs which are necessary for the appertaining, required filter function of the circuit arrangement are conducted out of the circuit arrangement.

A structural solution on the following basis is provided for the arithmetic unit:

Pipeline processing and parallel organization for handling the high data rate; and "bit slice" technique and cell concept in view of a place-saving regular realization.

The coefficients of the arithmetic unit can be represented as the sum of powers of two; the weighting is therefore to be realized by place-offset connection of the operands.

Figure 7:
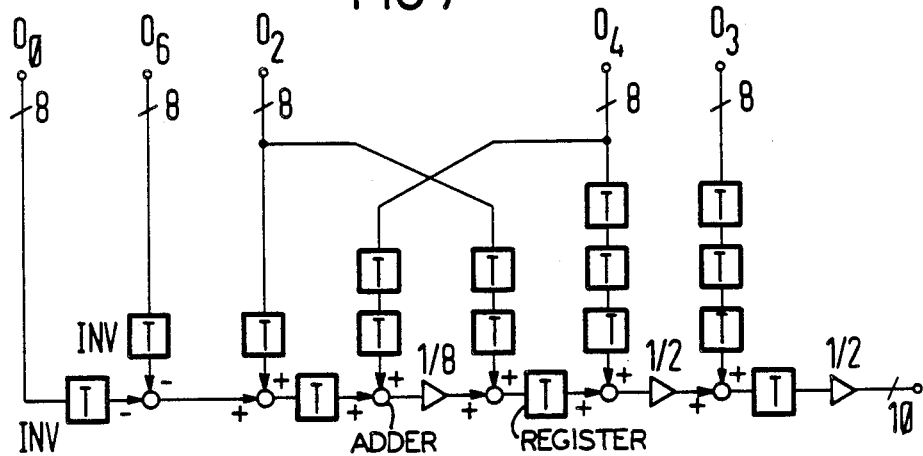
FIG. 7 is a schematic representation of the structure of an arithmetic unit given arrangement of the inputs according to increasing coefficients 1/32, ¼, ½ having a required word width of 10 bits, whereby the mesh node adders and the blocks T symbolize registers.
Figure 9A:
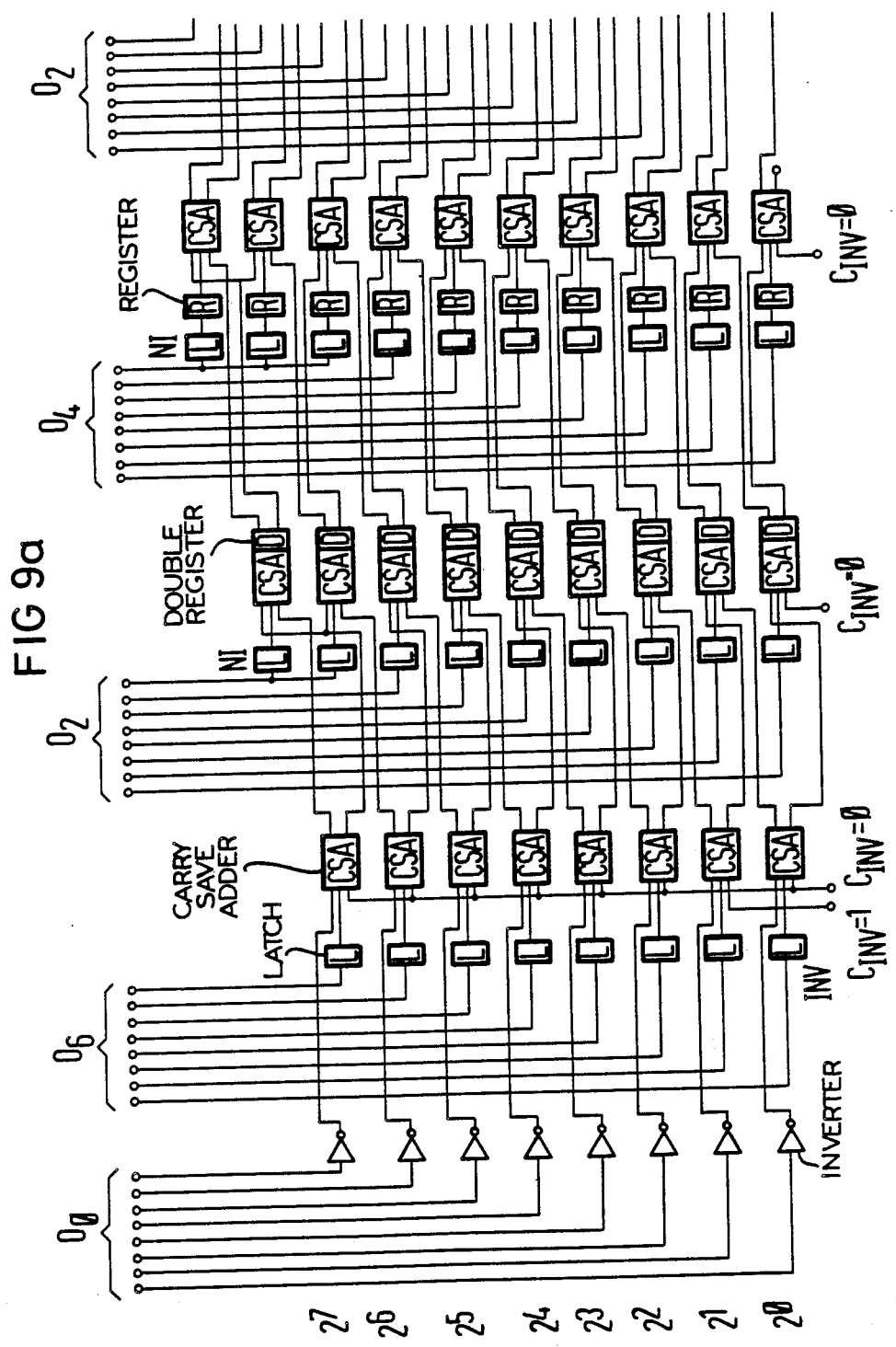
FIGS. 9a and 9b illustrate a hardware configuration of the structure of FIG. 7 in the case so-called carry-save adders are employed given two's complement representation of the data signals to be processed, whereby the symbol L stands for a latch, the symbol R for a register and the symbol D for a double register (for two variables)
Figure 9B:
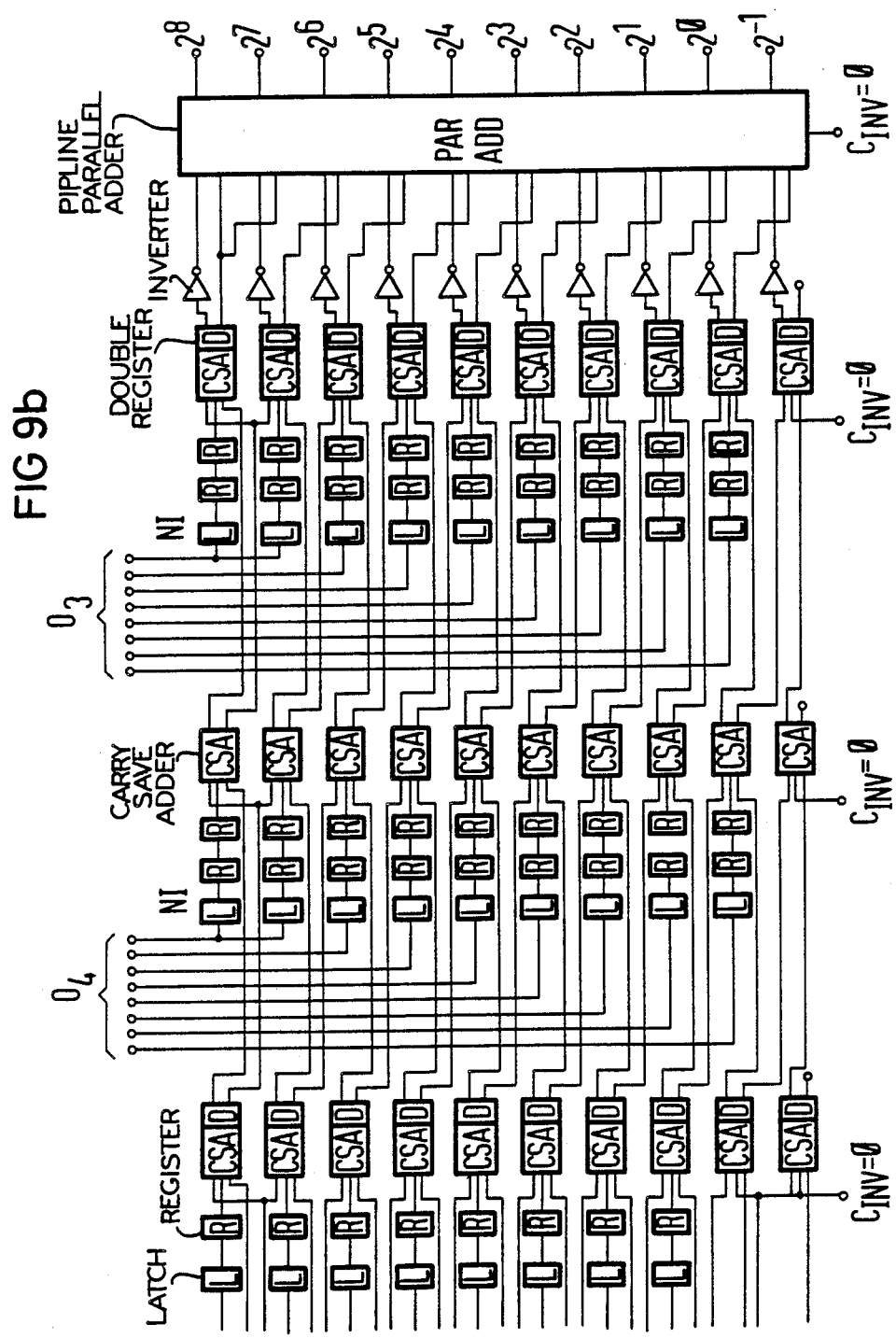
Figure 10A:
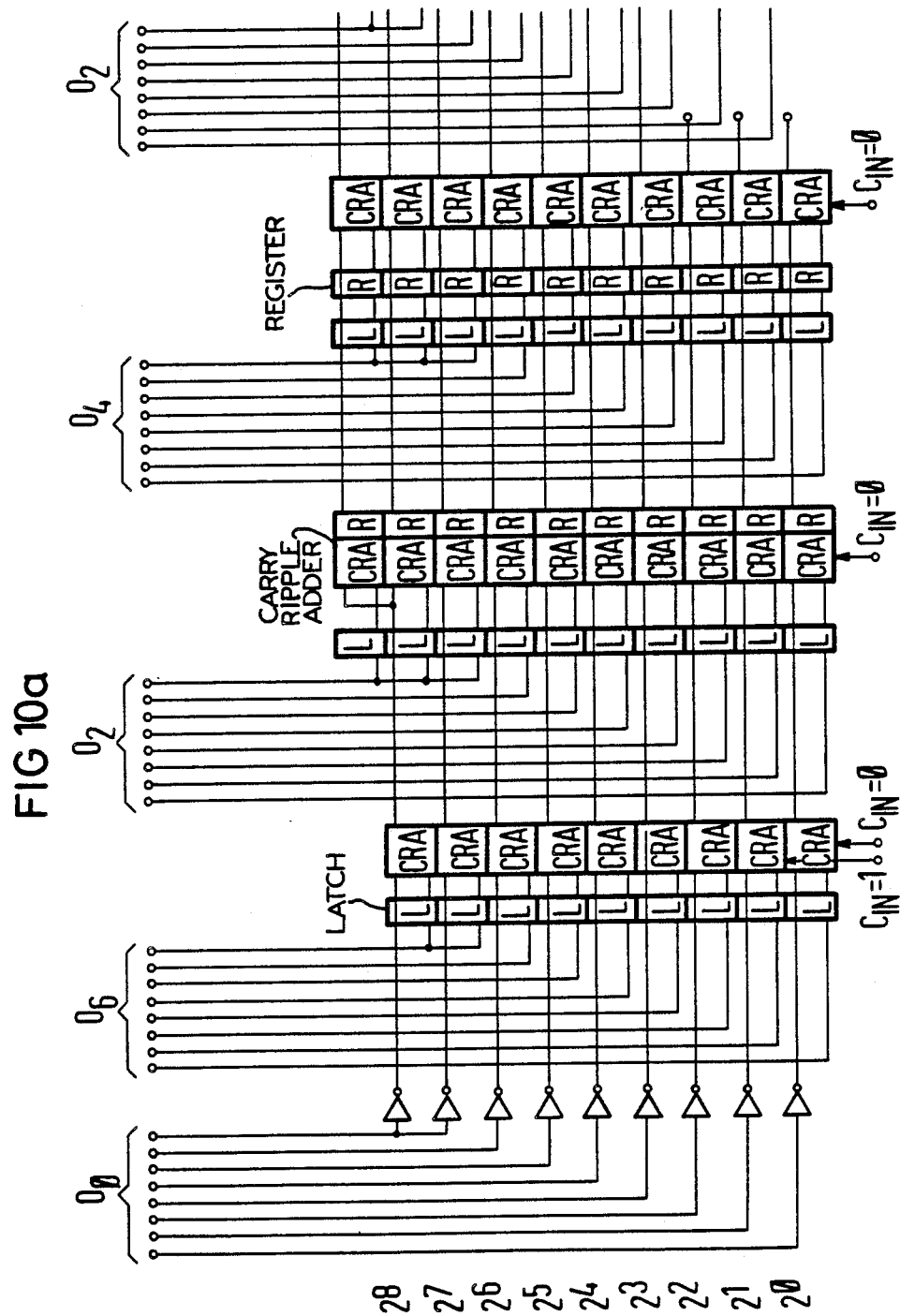
FIGS. 10a and 10b are an illustration of a further hardware configuration of the structure of FIG. 7 which employes what is referred to as a carry-ripple adder instead of carry-save adders, whereby the symbol L stands for a latch, the symbol R stands for a register and the symbol D for a double register (for two variables)
Figure 10B:
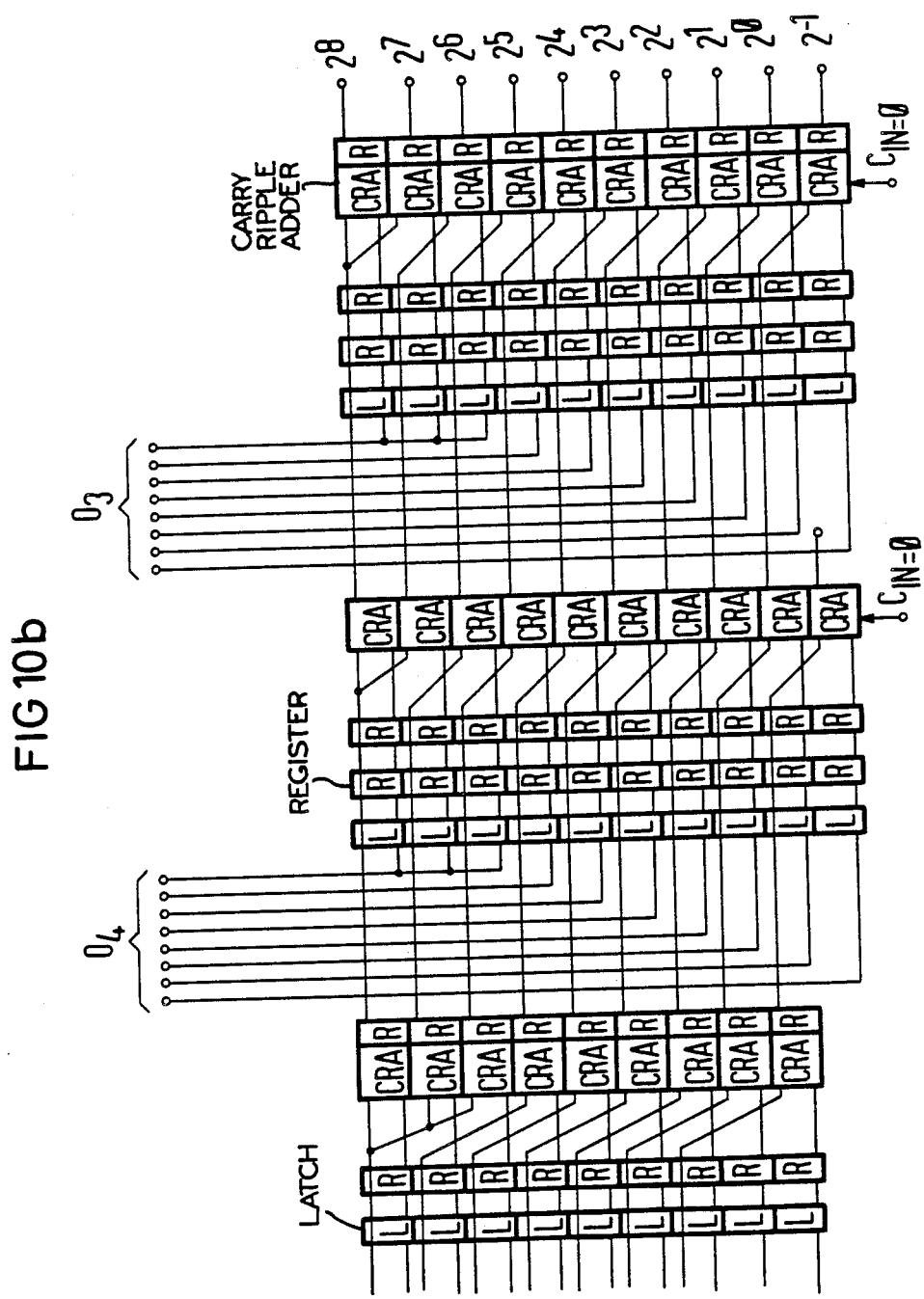

FIG. 7 illustrates a possible structure of the arithmetic unit. The input line groups are arranged here based on ascending amounts of the appertaining coefficients; the latter themselves now only occur in cascaded form in the horizontal branch. This proposed solution has the advantage that the places following the decimal point can be foregone in certain instances. This means lower word widths in the arithmetic unit (10 bits in the present case) and, therefore, a smaller space requirement. Further determinations are required for an unequivocal imaging of this structure on the hardware configuration. Calculations carried out in the two's complement code because of the simple representation of the subtraction. The carry-save concept is preferably provided for the addition in order to achieve a solution which is still meaningful at high data rates. An advantageous configuration as shown in FIG. 9 therefore derives under these preconditions.

Figure 12:
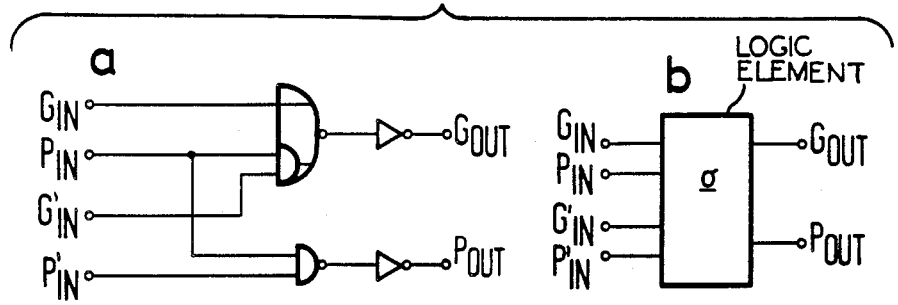
FIG. 12 is a symbolic representation and the equivalent block circuit diagram of a logic block for four input variables and two output variables, the circuit being employed in the circuit arrangement of the present invention according to FIG. 11.
Figure 13:
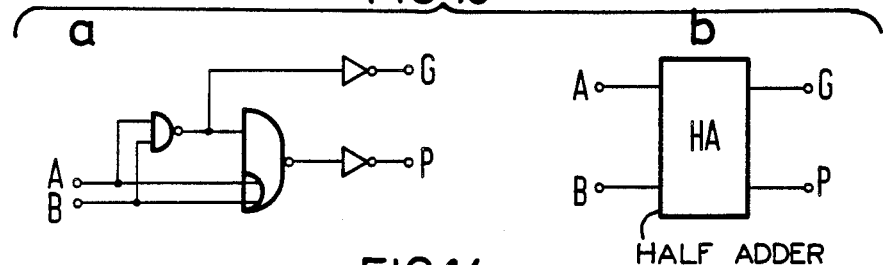
FIG. 13 is a symbolic representation and the equivalent block circuit diagram of a further logic block for two input variables and two output variables, the logic block being employed in a circuit arrangement of the invention according to FIG. 11.

The final working-up of the carries which is required is executed in a pipeline parallel adder PARADD. As already set forth, the two basic cells employed for this purpose are shown in FIG. 12 and in FIG. 13. These basic cells can be combined in various ways to form an adder configuration.

Figure 11:
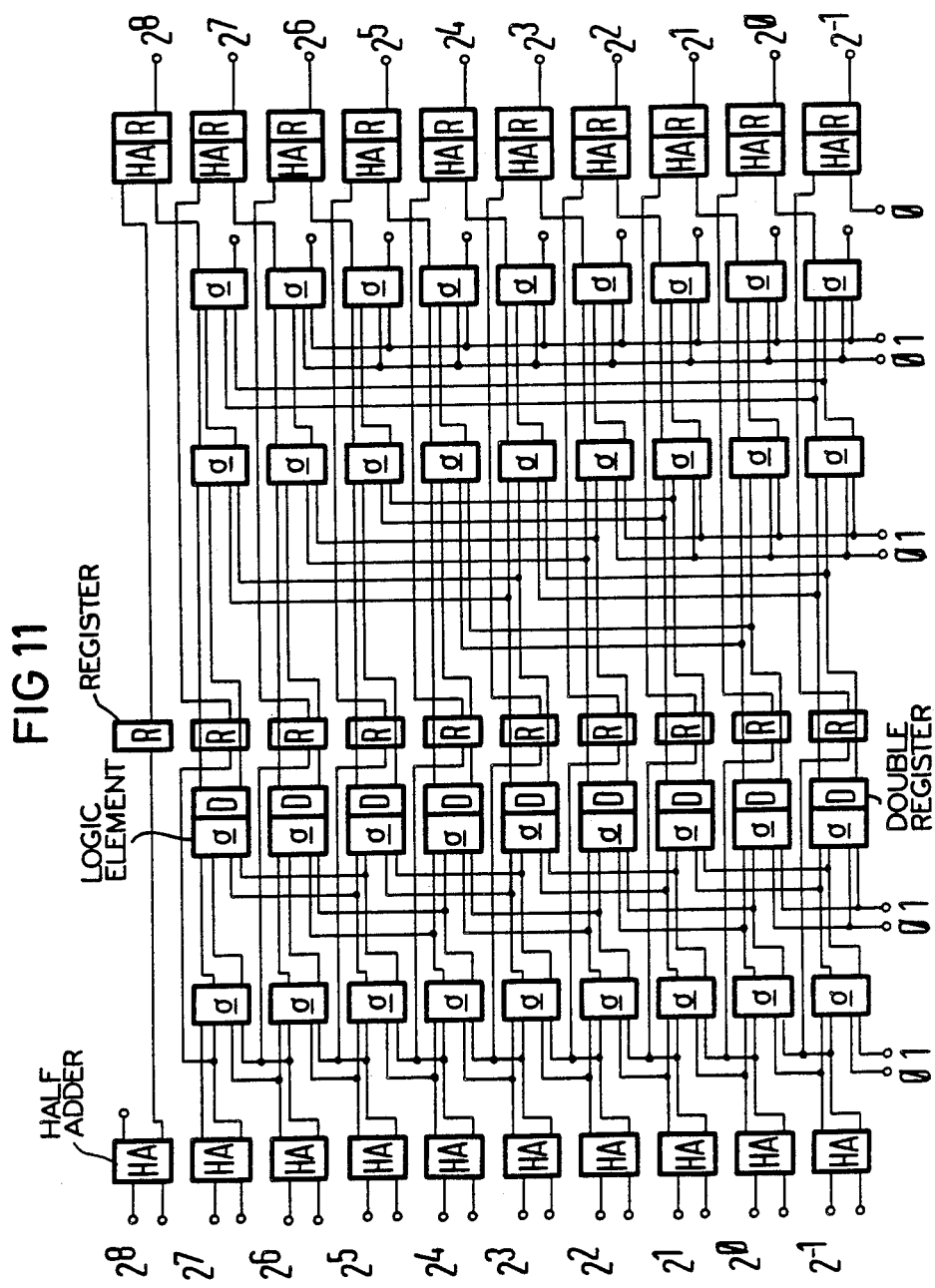
FIG. 11 is a schematic logic illustration of a parallel adder for a word width of 10 bits, whereby the symbol R is respectively employed for a register and the symbol D is employed for the double register (two variables)
Figure 14:
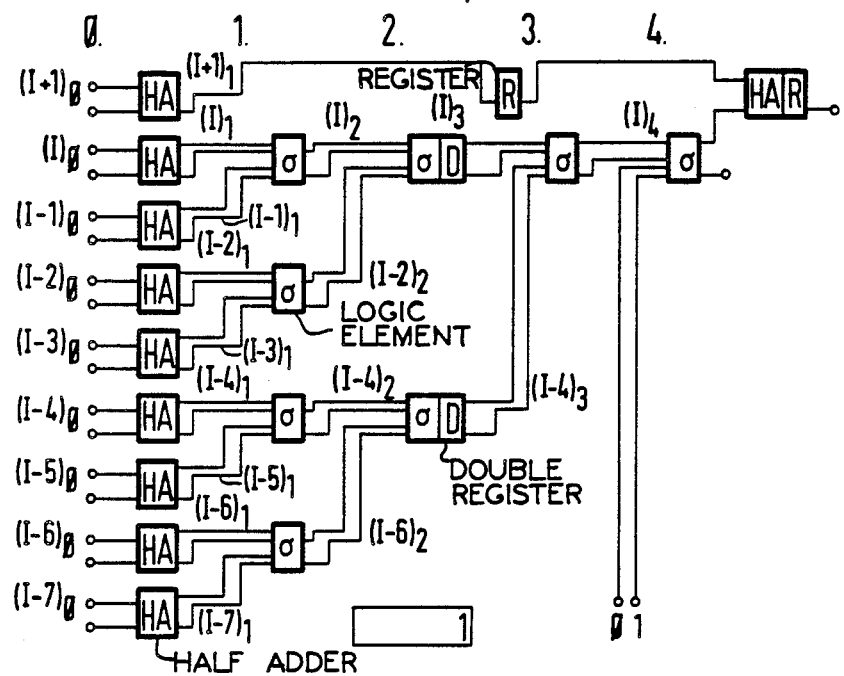
FIG. 14 is a schematic logic representation of the logic trees of FIG. 11, the logic tree being repeated n-times in this structure.

FIG. 11 and FIG. 14 illustrate a concept for this adder configuration which is considerably more favorable with respect to surface in comparison to known arrangements. The emphasized portion of FIG. 14 serves the purpose of illustrating the logic structure. In addition to half adders HA, the pipeline parallel adder PARADD contains known logic elements $\sigma$ for four input variables $G_{IN}$, $P_{IN}$, $G'_{IN}$ and $P'_{IN}$ and two outputs $G_{OUT}$ and $P_{OUT}$ having the logic functions:

$$G_{OUT} = G_{IN} \cup (G'_{IN} \cap P_{IN}); \text{ and}$$

$$P_{OUT} = P_{IN} \cap P'_{IN}.$$

It is further provided in accordance with the invention that, for generating the result of the $i^{th}$ place, the input variables $(i)_1$ and $(i-1)_1$, $(i-2)_1$ and $(i-3)_1$, $(i-4)_1$ and $(i-5)_1$ and so forth are respectively combined in pairs in a first level in accordance with these logical functions; that the results of this logical combination are in turn logically combined in a second level according to these logical functions as input variables for paired logical combinations $(i)_2$ and $(i-2)_2$, $(i-4)_2$ and $(i-6)_2$ and so forth, that so many logical combinations of this type are provided that only one result remains as a remainer, that the input variables $G_{IN}$, $P_{IN}$, $G'_{IN}$, $P'_{IN}$ for the first level are offered by an input group comprising half 'adders HA, whereby the input variables $G_{IN}$, $P_{IN}$ are formed by the half adder outputs G, P of the $i^{th}$ place and the input variables $G'_{IN}$, $P'_{IN}$ are formed by the half adder outputs G, P of the $(i-1)^{th}$ place, etc. The sum bits, namely the bits of the output data word, are formed such from the result bits of the last level of the logic elements and output variables of the input half adder group that the half adder HA of the $(i+1)^{th}$ place is occupied with the output signal $G_{OUT}$ of the logic element of the $i^{th}$ place and the output signal P of the input half adder HA of the $(i+1)^{th}$ place, etc. The inputs of the logic elements which are not used in this logic strategy are applied to corresponding, fixed auxiliary potentials, namely $G'_{IN}=0$ and $P'_{IN}=1$.

A feature of the invention provides that so-called carry-ripple adders are contained as logic elements in the arithmetic unit, whereby the data to be combined are likewise represented in two's complement.

The selection of the carry-save principle or of the carry-ripple principle is determined by the case of use or, respectively, the preconditions for the hardware realization of the overall circuit arrangement.

Due to its regular circuit structure, a circuit arrangement constructed in accordance with the present invention, as has been set forth above, is particularly suited for realization as a monolithically integrated MOS circuit.

Although we have described our invention by reference to particular illustrative embodiments thereof, many changes and modifications of the invention may become apparent to those skilled in the art without departing from the spirit and scope of the invention. We therefore intend to include within the patent warranted hereon all such changes and modifications as may reasonably and properly be included within the scope of our contribution to the art.

I claim:

1. A circuit arrangement for providing a variably adjustable time delay for a data stream of digital image data signals, comprising:

a plurality of memory matrices, each memory matrix including a plurality of storage elements arranged in columns and rows, each of said storage elements comprising a three-transistor cell having overlapping write/read cycles, a separate write bit line and a separate read bit line for each column respectively connected to each cell of the respective column, and a separate write word line and a separate read word line for each row respectively connected to each cell of the respective row, a reset control signal input for receiving a reset control signal, a continuously steppable clocked row selector including a plurality of cascaded selector stages each including two mutually offset signal outputs respectively connected to a write word line and a read word line and each including a control input connected to said reset control signal input for receiving a reset control signal at an arbitrary time for setting the first stage and resetting all other stages of said row selector, an undelayed data output and a plurality of delayed data outputs, a data input for receiving an input data stream to be delayed, said data input connected to said write bit line of a first of said column and to said undelayed data output, and a plurality of amplifiers each assigned to a respective column including an input connected to a respective read bit line of the respective column and an output connected to a respective delayed data output and to said bit write line of the adjacent column, the spacing between reset pulses selected to be equal to the desired delay between said undelayed data output and the delay output of the first column;

each memory matrix provided in accordance with the word width of the image data in which each of said matrices is connected to receive one data bit and offer the same time delayed at data word outputs as a respective corresponding bits of a plurality of differently time delayed output data words;

an arithmetic unit connected to said matrices to receive said output data words and combining the same in accordance with a predetermined filter function such that the two smallest coefficient outputs are combined and the result combined with the next largest coefficient output, the combining being repeated with respect to increasing coefficient magnitude until the largest coefficient output has been combined; and a plurality of digital time delay elements connected between said data word outputs and said arithmetic unit for compensating different transit times through said arrangement.

2. The circuit arrangement of claim 1, wherein:
said circuit arrangement is a monolithically integrated metal-oxide-semiconductor circuit.

3. The circuit arrangement of claim 1, wherein:
said row selector comprises a shift register in which each selector stage comprises a shift register stage having three taps and a logic block connected to said three taps to logically combine signals thereat for the respective write word line and the respective read word line.

4. The circuit arrangement of claim 1, wherein:
said arithmetic unit comprises carry-save adders and in which the data to be combined are represented in the two's complement.

5. The circuit arrangement of claim 1, wherein:
said arithmetic unit comprises carry-ripple adders and in which the data to be combined are represented in the two's complement.

6. The circuit arrangement of claim 1, wherein:
said arithmetic unit comprises pipeline parallel half adders including logic elements for four input variables $G_{IN}$, $P_{IN}$, $G'_{IN}$, $P'_{IN}$ and two outputs $G_{OUT}$, $P_{OUT}$ having the logical functions $$G_{OUT}=G_{IN}\cup(G'_{IN}\cap P_{IN})$$

$$P_{OUT}=P_{IN}\cap P'_{IN};$$

means for generating the result of the $i^{th}$ place by combining the input variables $(i)_1$, $(i-1)_1$, $(i-2)_1$ and $(i-3)_1$, $(i-4)_1$ and $(i-5)_1$, etc., in respective levels according to these functions;

means for combining the combinations in a second level as input variables for paired combinations $(i)_2$ and $(i-2)_2$, $(i-4)_2$ and $(i-6)_2$, etc. such that only one result remains as a remainder;

means, including a group of half adders, for offering input variables ($G_{IN}$, $P_{IN}$) for a group of input variables formed by the outputs (G,P) of the $i^{th}$ place and input variables ($G'_{IN}$, $P'_{IN}$) of the $(i-1)^{th}$ place, etc,; and means for forming the sum, the output bits of an output data word, from the result bits of the last level of logic elements, and the outputs of the half adders of the $(i+1)^{th}$ place is occupied by the output signal of the logic element of the $i^{th}$ place and the output signal (P) of the input adder of the $(i+1)^{th}$ place, etc.;

said logic elements including inputs not used in the above combinations connected to fixed auxiliary potentials ($G'_{IN}=\emptyset$ and $P'_{IN}=1$).

* * * * *